United States Patent
Yoo

(10) Patent No.: US 7,105,455 B2
(45) Date of Patent: Sep. 12, 2006

(54) METHOD FOR FABRICATING NONVOLATILE MEMORY DEVICE

(75) Inventor: Seung Jong Yoo, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 186 days.

(21) Appl. No.: 10/749,843

(22) Filed: Dec. 31, 2003

(65) Prior Publication Data

US 2004/0157395 A1   Aug. 12, 2004

(30) Foreign Application Priority Data

Dec. 31, 2002   (JP)   .................... 10-2002-0087897

(51) Int. Cl.
   *H01L 21/302*   (2006.01)
(52) U.S. Cl. .................... 438/723; 438/243; 438/706; 438/724
(58) Field of Classification Search ................ 438/706, 438/710, 712, 720, 723, 724, 243, 250
See application file for complete search history.

(56) References Cited

U.S. PATENT DOCUMENTS

| | | | | |
|---|---|---|---|---|
| 5,643,824 A | * | 7/1997 | Chien et al. ................. | 438/439 |
| 5,801,083 A | * | 9/1998 | Yu et al. ...................... | 438/424 |
| 5,968,844 A | * | 10/1999 | Keller ......................... | 438/695 |
| 5,976,769 A | * | 11/1999 | Chapman .................... | 430/316 |
| 6,319,822 B1 | | 11/2001 | Chen et al. | |
| 6,342,451 B1 | * | 1/2002 | Ahn ............................ | 438/706 |
| 6,368,974 B1 | | 4/2002 | Tsai et al. | |
| 6,579,808 B1 | | 6/2003 | Cho et al. | |

* cited by examiner

*Primary Examiner*—Lan Vinh
(74) *Attorney, Agent, or Firm*—Andrew D. Fortney

(57) ABSTRACT

A method of fabricating a nonvolatile memory device is disclosed. First, a lower insulating layer and a sacrificial layer are formed in sequence on a substrate. Then, a sacrificial layer pattern is formed through removing some part of the sacrificial layer by an etching process to expose some part of the lower insulating layer. At the same time, spacers are formed on sidewalls of the sacrificial layer pattern. The spacers are formed of polymers resulting from the etching of the sacrificial layer. The exposed lower insulating layer is removed to form a lower insulating layer pattern. Next, the sacrificial layer pattern and the spacers are removed. Accordingly, linewidth of a tunnel window which defined by the insulating layer pattern becomes narrow.

17 Claims, 4 Drawing Sheets

METHOD FOR FABRICATING NONVOLATILE MEMORY DEVICE

BACKGROUND OF THE INVENTION

1. Field of the Invention

The present invention relates to a method for fabricating a memory device and, more particularly, to a method fabricating a nonvolatile memory device such as electrically erasable programmable ROM (EEPROM).

2. Background of the Related Art

With the development of high-capacity memory devices, nonvolatile memory devices are being increasingly important. An example of the nonvolatile memory device is EEPROM.

In the EEPROM, a tunneling region is formed under a floating gate region. Here, the tunneling region has to be narrower than the floating gate region in order to ensure high coupling ratio. The tunneling region is defined as a tunnel window. The tunnel window is one of most important parts in a nonvolatile memory device. The memory device operates by movement of electrons through the tunnel window.

FIG. 1 illustrates, in a cross-sectional view, a structure comprising an oxide pattern 10 and a gate poly pattern 14 on a substrate 10. Here, "L1" indicates a tunnel window. FIG. 2 is a graph illustrating relation between the width of tunnel window and the coupling ratio in a nonvolatile memory device. The coupling ratio increases as the width of the tunnel window becomes narrower. Therefore, present technology now focuses on the development of the process for forming a narrow tunnel window.

FIGS. 3a and 3b illustrate, in cross-sectional views, the fabricating process of a nonvolatile memory device according to a conventional method.

Referring to FIG. 3a, an oxide layer 32 is formed on a substrate 30 and a photoresist pattern 34 is formed on the oxide layer 32. Referring to FIG. 3b, some part of the oxide layer 32 is removed by an etching process using the photoresist pattern 34 as a mask to form an oxide pattern 32a. The etching process is generally wet etching and, therefore, the oxide pattern 32a is etched isotropically. As a result, linewidth of the region etched in the oxide pattern 32a is broader than the linewidth defined by the photoresist pattern. Such broadened linewidth results in low coupling ratio, thereby causing deterioration of device characteristics.

In manufacturing a semiconductor device, a lot of methods for shrinking critical dimension of any structure have been proposed. Among them, U.S. Pat. No. 6,579,808, Cho et al., discloses a method for fabricating a semiconductor device capable of maintaining contact hole of fine size when the contact hole for bit line formation is defined. The disclosed method by the Cho et al. patent comprises forming an insulating layer and an ARC (anti-reflective coating) layer on a substrate; removing some part of the ARC layer through a first dry etching process using a photoresist pattern as a mask and, at the same time, attaching polymers resulting from the dry etching process to the remaining ARC layer to form a polymer sidewall; and removing some part of the insulating layer through a second dry etching process using the photoresist pattern and the polymer sidewall as a mask to form a contact hole.

As another example, U.S. Pat. No. 6,368,974, Tsai et al., proposes a method for shrinking equivalent critical dimension of mask by in situ polymer deposition and etching. In the method by Tsai et al. patent, a polymer layer is formed on a photoresist layer and etched by a plasma reactor with at least two independent power sources. Here, voltages of all power source are adjusted such that etching rate and depositing rate are equivalent on surface of the photoresist layer and etching rate is larger than depositing rate in bottom of any structure of the photoresist layer. Therefore, the sidewall of any structure is filled by a conformal polymer layer and, then, width of any structure is efficiently decreased. Accordingly, the critical dimension of any structure is significantly smaller than critical dimension of the mask.

As another example, U.S. Pat. No. 6,319,822, Chen et al., discloses a method for etching of sub-quarter micron openings in insulating layers for contacts and via. The method by Chen et al. patent uses a hardmask formed of carbon enriched titanium nitride. The carbon is released as the hardmask erodes during plasma etching and participates in the formation of a protective polymer coating along sidewalls of the opening etched in the insulating layer. The protective sidewall polymer inhibits lateral chemical etching.

SUMMARY OF THE INVENTION

Accordingly, the present invention is directed to a method of fabricating a nonvolatile memory device that substantially obviates one or more problems due to limitations and disadvantages of the related art.

An object of the present invention is to provide a method for forming an oxide pattern, which defines tunnel window size, so that the tunnel window can have the same linewidth with that defined originally in fabricating a nonvolatile memory device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the present invention provides a method for fabricating a nonvolatile memory device comprising the steps of:

forming a lower insulating layer and a sacrificial layer in sequence on a substrate;

forming a sacrificial layer pattern by removing some part of the sacrificial layer through an etching process to expose some part of the lower insulating layer, wherein spacers are formed on sidewalls of the sacrificial layer pattern, the spacers being formed of polymers resulting from the etching of the sacrificial layer;

removing the exposed lower insulating layer to form a lower insulating layer pattern; and removing the sacrificial layer pattern and the spacers.

Subsequently, an upper oxide layer with uniform thickness is formed on the lower insulating layer pattern and a gate poly is formed on the upper oxide layer. As a result, a gate electrode of a nonvolatile memory device such as EEPROM is completed.

Here, the lower insulating layer is preferably formed of oxide and the sacrificial layer is preferably formed of nitride. The spacers preferably have a width between 300 Å and 1000 Å.

The present invention uses the spacers resulting from etching of the sacrificial layer as an etching mask and, therefore, the region etched in the lower insulating layer pattern can have narrow linewidth. Therefore, linewidth of the tunnel window, which is defined by the linewidth of the region etched in the lower insulating layer pattern, becomes narrow. By reducing the linewidth of the tunnel window, the present invention can ensure high coupling ratio, thereby improving device characteristics.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
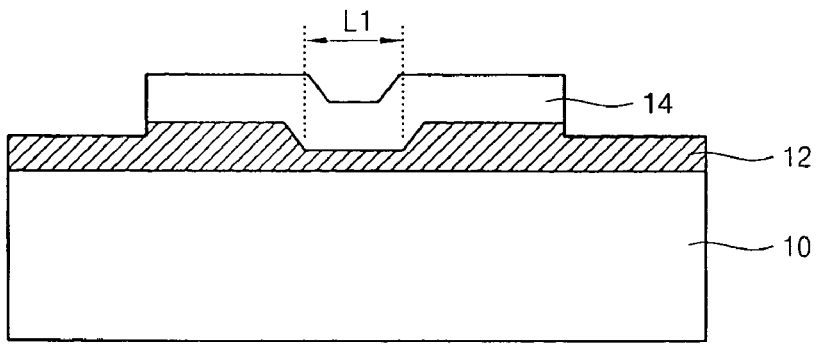
FIG. 1 illustrates, in a cross-sectional view, a structure comprising an oxide pattern and a gate poly pattern.
Figure 2:
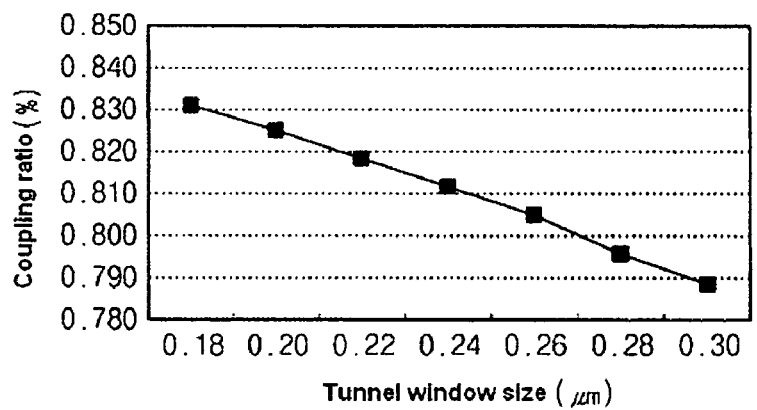
FIG. 2 is a graph illustrating relation between width of a tunnel window and coupling ratio in a nonvolatile memory device.
Figure 3A:
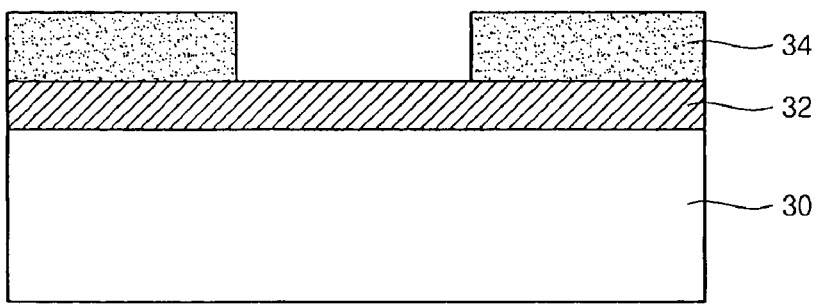
FIGS. 3a and 3b illustrate, in cross-sectional views, the fabricating process of a nonvolatile memory device according to a conventional method.
Figure 3B:
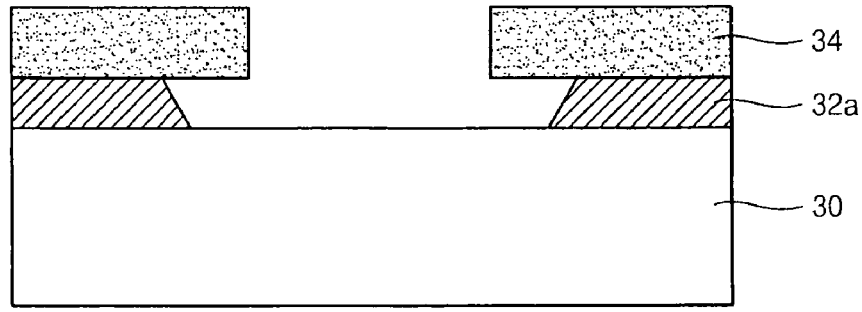
Figure 4A:
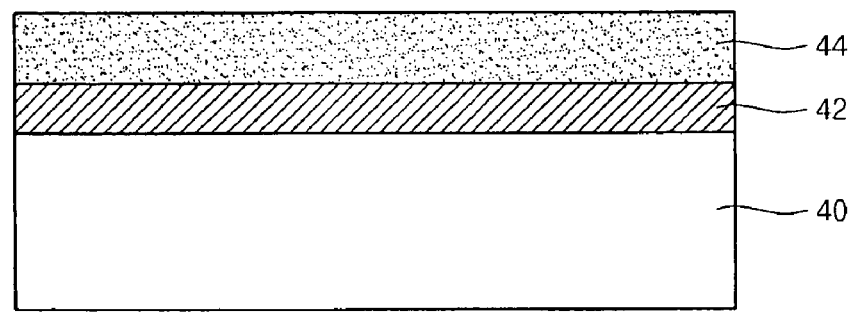
FIGS. 4a through 4f illustrate, in cross-sectional views, the fabricating process of a nonvolatile memory device according to the present invention.

Referring to FIG. 4a, a lower insulating layer 42 and a sacrificial layer 44 are formed in sequence on a substrate 40. Here, the lower insulating layer 42 is preferably formed of oxide. The sacrificial layer 44 is preferably formed of nitride because a lot of polymers have to be generated while the sacrificial layer 44 is etched and because the lower insulating layer 42 is formed under the sacrificial layer 44.

Figure 4B:
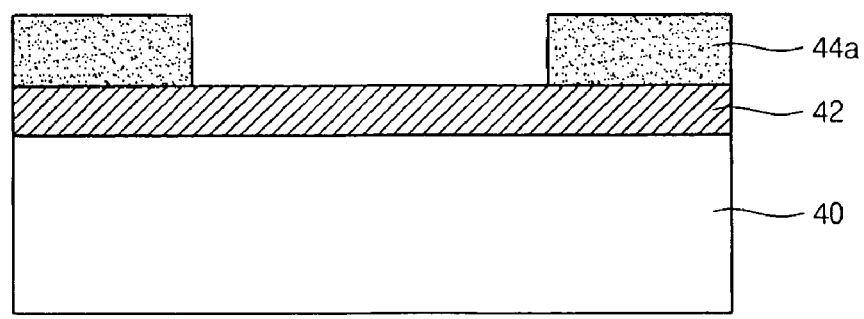
Figure 4C:
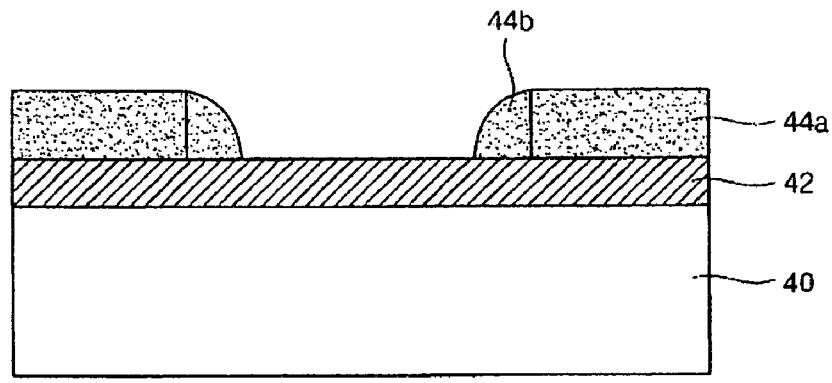

Referring to FIGS. 4b and 4c, a photoresist pattern (not shown) is formed on the sacrificial layer 44. Then, an etching process is performed using the photoresist pattern as a mask to form a sacrificial layer pattern 44a. Here, the photoresist pattern can be sufficiently formed by using a source of light with a wavelength of i-line because spacers are formed as described in the following. In this regard, the present invention can reduce manufacturing costs by using the wavelength of i-line that is relatively easily applicable.

During the etching process, polymers are generated from the etching. The polymers are attached to sidewalls of the sacrificial layer pattern 44a etched to form spacers 44b. The spacers 44b preferably have a width between 300 Å and 1000 Å. As a result, the etched region of the sacrificial layer pattern 44a has narrower linewidth than that defined by the photoresist pattern because of the spacers 44b.

Figure 4D:
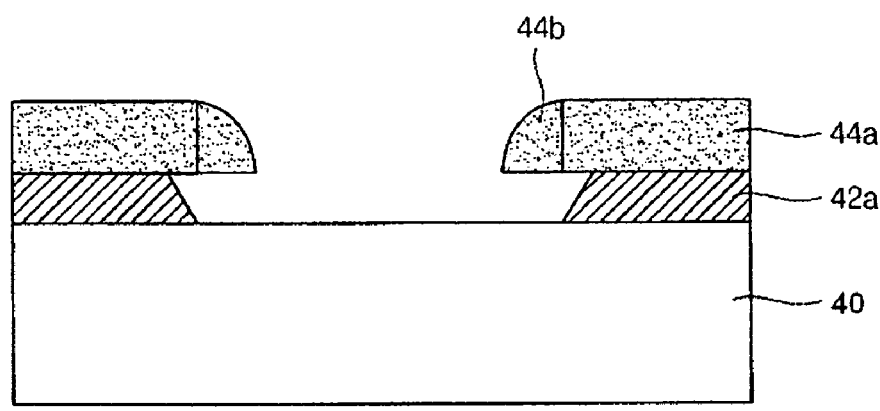

Referring to FIG. 4d, an etching process is performed by using the photoresist pattern (not shown) and the sacrificial layer pattern 44a including the spacers 44b as an etching mask to form a lower insulating layer pattern 42a. The etching process is wet etching and, therefore, the lower insulating layer pattern 42a is etched isotropically. However, the linewidth of the region etched in the lower insulating layer pattern 42a does not become broader than the linewidth defined by the photoresist pattern although the isotropic etching is performed, because the sacrificial layer pattern 44a including the spacers 44b is used as an etching mask. Thus, the region etched in the lower insulating layer pattern 42a can have the desired linewidth and, therefore, the tunnel window defined by the lower insulating layer pattern 42a can maintain the desired linewidth.

Figure 4E:
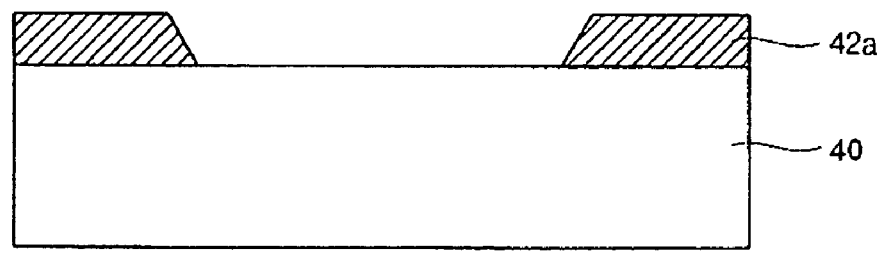
Figure 4F:
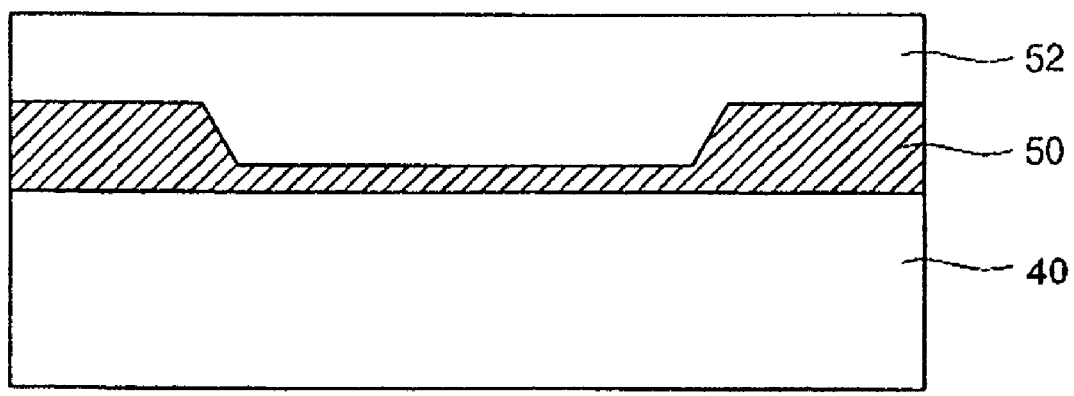

Referring to FIG. 4e, the photoresist pattern, the sacrificial layer pattern 44a, and the spacers 44b are removed. Referring to FIG. 4f, an upper oxide pattern is formed on the lower insulating layer pattern 42a to form an oxide pattern 50, a tunnel oxide. Then, a gate poly is formed on the oxide pattern 50 to complete a gate electrode structure of EEPROM.

The present invention uses a sacrificial layer pattern having spacers as an etching mask and, therefore, can easily adjust linewidth of region etched in an oxide pattern which defines a tunnel window. Thus, the present invention can improve device characteristics by increasing coupling ratio. In addition, if deep UV-line is used as a source of light and a dry etching process is performed in manufacturing a nonvolatile memory device, it may increases manufacturing costs although it can easily adjust the linewidth of region etched in the oxide pattern. However, the present invention can reduce manufacturing costs by employing i-line as a source of light and performing wet etching. Therefore, the present invention can improve productivity and reliability in manufacturing a nonvolatile memory device.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a nonvolatile memory device comprising:
    forming a lower insulating layer and a sacrificial layer on a semiconductor substrate;
    patterning the sacrificial layer and forming spacers on sidewalls of the sacrificial layer pattern, the spacers comprising polymers resulting from the patterning of the sacrificial layer;
    removing an exposed lower insulating layer using the sacrificial layer pattern and the spacers as an etching mask to form a lower insulating layer pattern;
    removing the sacrificial layer pattern and the spacers;
    forming an upper oxide layer with uniform thickness on the lower insulating layer pattern; and
    forming gate poly on the upper oxide layer.

2. The method as defined by claim 1, wherein the spacers have a width between 300 Å and 1000 Å.

3. The method as defined by claim 1, wherein the method increases a coupling ratio of the nonvolatile memory device relative to a method that removes the exposed lower insulating layer using the sacrificial layer pattern alone as a etching mask.

4. The method as defined by claim 1, wherein the sacrificial layer comprises a nitride.

5. The method as defined by claim 4, wherein the lower insulating layer comprises an oxide.

6. The method as defined by claim 1, wherein removing the exposed lower insulating layer comprises wet etching the exposed lower insulating layer.

7. The method as defined by claim 6, wherein a region removed from the lower insulating layer pattern has a narrow linewidth relative to removing the exposed lower insulating layer using the sacrificial layer pattern alone as an etching mask.

8. The method as defined by claim 1, further comprising forming a tunnel oxide on the semiconductor substrate.

9. The method as defined by claim 8, further comprising forming a gate poly layer on the tunnel oxide.

10. The method as defined by claim 1, further comprising forming a photoresist pattern on the sacrificial layer.

11. The method as defined by claim 10, wherein patterning the sacrificial layer and forming spacers comprises etching the sacrificial layer using the photoresist pattern as a mask.

12. The method as defined by claim 11, wherein forming the photoresist pattern comprises irradiating the phororesist with a source of light having an i-line wavelength.

13. The method as defined by claim 12, wherein an etched region of the sacrificial layer pattern has a narrower linewidth than that defined by the photoresist pattern.

14. The method as defined by claim 11, wherein the etched region of the sacrificial layer pattern has narrower linewidth than that defined by die photoresist pattern.

15. The method as defined by claim 14, wherein removing the exposed lower insulating layer composes wet etching the exposed lower insulating layer.

16. The method as defined by claim 15, wherein an etched region in the lower insulating layer pattern has a linewidth not broader than a linewidth defined by the photoresist pattern.

17. The method as defined by claim 11, wherein the spacers are formed of polymers resulting from the etching of the sacrificial layer.

* * * * *